(12) United States Patent
Fischer et al.

(10) Patent No.: US 9,441,297 B2
(45) Date of Patent: Sep. 13, 2016

(54) PROCESS AND APPARATUS FOR THE APPLICATION OF SOLID LAYERS

(75) Inventors: Dieter Fischer, Renningen (DE); Martin Jansen, Leonberg (DE); Xermán F. De La Fuente Leis, Zaragoza (ES)

(73) Assignee: MAX-PLANCK-GESELLSCHAFT ZUR FOERDERUNG DER WISSENSCHAFTEN E.V., Munich (DE)

( * ) Notice: Subject to any disclaimer, the term of this patent is extended or adjusted under 35 U.S.C. 154(b) by 455 days.

(21) Appl. No.: 13/699,573

(22) PCT Filed: May 19, 2011

(86) PCT No.: PCT/EP2011/058101
§ 371 (c)(1),
(2), (4) Date: Feb. 4, 2013

(87) PCT Pub. No.: WO2011/147730
PCT Pub. Date: Dec. 1, 2011

(65) Prior Publication Data
US 2013/0149470 A1    Jun. 13, 2013

(30) Foreign Application Priority Data

May 25, 2010   (DE) ........................ 10 2010 021 444

(51) Int. Cl.
*C23C 14/30*   (2006.01)
*H05B 7/00*   (2006.01)
(Continued)

(52) U.S. Cl.
CPC ............... *C23C 16/48* (2013.01); *C23C 14/28* (2013.01); *C23C 14/548* (2013.01)

(58) Field of Classification Search
CPC ... C23C 14/28; C23C 14/30; C23C 14/3464; C23C 14/3485; C23C 14/3492
See application file for complete search history.

(56) References Cited

U.S. PATENT DOCUMENTS 5,490,912 A * 2/1996 Warner et al. ........... 204/298.02
5,654,975 A * 8/1997 Green et al. ................. 372/24
(Continued)

FOREIGN PATENT DOCUMENTS

EP         0 770 700       5/1997
JP         06279180        10/1994
(Continued)

OTHER PUBLICATIONS

International Preliminary Report on Patentability dated Nov. 27, 2012, for PCT/EP2011/058101.
(Continued)

*Primary Examiner* — Michael Wieczorek
(74) *Attorney, Agent, or Firm* — Lathrop & Gage LLP (57) ABSTRACT

The invention relates to a process for applying solid layers (14) to an object (12) to be coated by means of at least one radiation source (2), in particular a laser radiation source, which comprises at least the step of removal of a sample (4) in the solid state in at least partially different sections (6) by means of at least one beam (8) emitted by the radiation source (2) to at least partly convert the sample (4) into a gaseous state (10) which deposits at least partially on the object (12) to be coated in order to form a solid layer (14), where at the same time the alignment of a trace of the emitted beam (8) is altered during the step of removal of the sample and the sample (4) is moved.

13 Claims, 9 Drawing Sheets

(51) Int. Cl.
*C23C 16/48* (2006.01)
*C23C 14/28* (2006.01)
*C23C 14/54* (2006.01)

(56) References Cited

U.S. PATENT DOCUMENTS

| | | | |
|---|---|---|---|
| 6,660,343 B2* | 12/2003 | McGill | B05D 1/60 118/620 |
| 7,608,308 B2* | 10/2009 | Liu | C23C 14/083 427/586 |
| 7,687,436 B2* | 3/2010 | Varanasi et al. | 505/325 |
| 2004/0110042 A1 | 6/2004 | Holesinger et al. | |
| 2005/0067389 A1 | 3/2005 | Greer et al. | |
| 2007/0129255 A1 | 6/2007 | Varanasi et al. | |

FOREIGN PATENT DOCUMENTS

| | | |
|---|---|---|
| JP | 6293958 | 10/1994 |
| JP | 2005171269 | 6/2005 |
| WO | WO 00/44822 | 8/2000 |

OTHER PUBLICATIONS

International Search Report for PCT/EP2011/058101, mailed Jul. 21, 2011.

* cited by examiner

PROCESS AND APPARATUS FOR THE APPLICATION OF SOLID LAYERS

CROSS-REFERENCE TO RELATED APPLICATIONS

This application is a U.S. National Stage Application under 35 U.S.C. §371 of International Application No. PCT/EP2011/058101, filed May 19, 2011, which claims the benefit of German Application No. 10 2010 021 444.2, filed May 25, 2010. Both of these applications are hereby incorporated by reference in their entireties.

DESCRIPTION

The invention relates to a process and an apparatus for applying solid layers to an object to be coated by means of at least one radiation source, in particular a laser radiation source, comprising the step of removing a sample, which can comprise different material portions, by means of a beam emitted by the radiation source for converting the material of the sample surface from a solid state to a gaseous state, also referred to as gas phase, which is deposited as a thin film on the object to be coated.

In the production of coatings, in particular of protective layers against corrosion and material wear, optical coatings and supraconducting or ferromagnetic functional layers, and also in metrology and control engineering, it is necessary for layers to be thin, in the range of several nanometers to micrometers, according to their function. Layers of this type are conventionally produced by means of laser beam vaporisation. In this method, the material to be applied is generally provided in the form of a disc-like sample. Using high-energy pulse lasers, the material of the sample surface is converted from the solid state to the gaseous state and is simultaneously accelerated in a targeted manner, such that the resulting gaseous cloud of material that has been removed from the sample surface is deposited as a thin solid layer on a nearby object. However, material particles tend to agglomerate in the gas phase. If these agglomerates are deposited on the object to be coated, the quality of the deposited solid layer is impaired in that a solid layer of uniform thickness, which is vital for the use of the solid layers inter alia in control engineering and metrology for the correct transmission of electronic signals, is not formed.

Usually, only small and thin faces in the order of a few square centimeters are coated by means of laser beam vaporisation. In this context, the surface of the sample is often removed while rotating the sample or displacing the sample in the x/y direction, the course of the emitted beam simultaneously being stationary. As is known from the prior art, the conventional process of laser beam vaporisation is dependent on numerous process parameters, for example the energy of the emitted beam, the pulse train, the speed of removal of the sample material, the material composition of the sample or the arrangement of the object to be coated in relation to the orientation of the sample.

In addition, for the deposition of different materials, a plurality of separate samples are used which can be arranged side by side in an integrated manner in what is known as a sample changer, the sample change guiding the individual samples in succession into the beam position. This results in a complex coating process in which only one material composition at a time is removed by the beam and deposited as a new coating.

US 2005/0067389 A1 describes a two-stage laser beam vaporisation process in which the laser beam initially follows a fixed path in the x/y direction, completes this, and the sample is rotated through a fixed angle only in a second step. This sequence occurs periodically and makes it possible to reduce the erosion of the sample. As a result of this uniform repeated sequence of steps, one region of the sample remains unremoved owing to the fixed angle of rotation, and this leads to shadowing effects. Shadowing effects are generally understood to mean the limited spreading of the gaseous state of the removed sample owing to projecting solid material in the form of edges. In addition, the probability of the formation of material fragments from the surface of the sample, in particular material fragments from the projecting edges, which are deposited in their entirety on the object to be coated, is increased. These material fragments, the size of which can extend into the millimeter range, from the surface of the sample cause great variations in the layer thickness of the solid layer. However, for the use of the objects coated with the solid layer it is necessary for the solid layer to be thin, preferably having a layer thickness in the nanometer or micrometer range, and uniform, that is to say that the deposited solid layer on the object to be coated has a comparable layer thickness at any position.

Proceeding from the known prior art, the object of the invention is to provide a process and an apparatus for applying solid layers to an object to be coated, which allow uniform removal of the sample surface, which can consist of different material portions, irrespective of the material while reducing the formation of undesirable material fragments from the surface of the sample, and with which it is also possible to achieve uniform coating, without differences in layer thickness, of large-scale objects in the square meter range.

According to the invention, this object is achieved with regard to the process by simultaneous movement of a sample and alteration of the orientation of the course of the emitted beam during the removal step according to the features of claim 1 and with regard to the apparatus according to the features of claim 10.

According to a preferred embodiment, the movement altering the orientation of the course of the emitted beam takes place on the basis of or independently of the movement of the sample, the sample crossing the course of the emitted beam. In the case of dependency, the alteration movement which determines the orientation of the course of the emitted beam and the movement of the sample are interlinked for example in terms of their movement speed. It is thus conceivable that, in the case of a disc-like sample, the movement of which consists in a rotation about a central axis of the sample, an increase in the speed of rotation brings about a reduction in the speed of the movement altering the course of the emitted beam. In this case, the axis which extends perpendicular to the surface of the sample through the centre point of the surface of the sample is set as the central axis of the sample. In addition, an increase (decrease) in the speed of movement of the sample can likewise bring about an increase (decrease) in the speed of the movement altering the course of the emitted beam.

In addition, it is also conceivable for the alteration movement which determines the orientation of the course of the emitted beam and the movement of the sample to take place mutually independently in terms of their speed, for example. This has the advantage that each of the movements can be controlled individually, in that the process parameters, for example the point at which the emitted beam hits the surface of the sample or even the speed of movement of the sample, can be adjusted individually without the other process parameters being influenced by this alteration. The movement altering the orientation of the course of the emitted beam and the movement of the sample are advantageously controlled and monitored by means of a computer control system.

According to another preferred embodiment, the orientation of the beam course is altered in such a way that a linear movement of the beam on the surface of the sample which crosses the course of the emitted beam is produced. The linear movement of the beam on the surface of the sample can for example be horizontal, vertical or in a combination of the two directions, the direction altering the orientation of the course of the emitted beam being in relation to the original undisplaced beam. In this case, the linear movement of the beam on a surface of a disc-like sample can for example pass through the centre point of the surface of the sample. If, however, the sample has a rectangular geometry, the linear movement preferably takes place over the entire surface of the sample. In addition, the movement altering the orientation of the emitted beam via beam deflection means can describe a circular-cone-like shape, which is represented as a rotating beam on the surface of the sample.

According to another advantageous embodiment, the emitted beam hits at a predeterminable angle the surface of the sample which crosses the course of the emitted beam, the sample simultaneously rotating preferably about a central axis which extends perpendicular to the surface of the sample through the centre point of the surface of the sample. The predeterminable angle of the beam is the angle formed by the emitted beam and the sample surface when the beam hits said surface. The predeterminable angle is preferably selected such that the movement altering the course of the beam passes through the centre point of the surface. The rotation of the sample is preferably slow in comparison to the alteration of orientation of the course of the emitted beam. The speed of rotation of the sample is between 0.1 and 250 revolutions per minute, preferably between 1 and 50 revolutions per minute.

According to another preferred embodiment, the beam hits at a predeterminable angle the surface of the sample which crosses the course of the emitted beam, a position of the sample simultaneously being altered in a direction extending perpendicular to the course of the beam. This alteration of the position of the sample can take place horizontally or vertically or in a combination of the two movements. The speed of the movement altering the position of the sample is preferably slow in comparison to the movement altering the course of the emitted beam, preferred speeds being between 0.01 and 50 µm per second.

According to another preferred embodiment, it is advantageous if the sample is composed of different portions which preferably consist of different materials. If the sample is, for example, disc-like and comprises sector-like portions of the sample which differ in terms of material composition, then with simultaneous rotation of the sample about its central axis and the alteration of the orientation of the course of the emitted beam, a periodic material concentration sequence of the deposited solid layer on the object to be coated can be achieved. The composition of a single coat of the deposited solid layer corresponds, in the simplest example, to the composition of a portion of the sample and respectively, in more complex cases, any desired variations in the layer compositions are determined by the selection of the material portions to be removed. The sum of all deposited coats forms the solid layer. The periodicity of the deposited coats of the solid layer is preferably determined by the speed of the movement of the sample and the movement of the course of the emitted beam in its deflection. In addition, the length of the route which the deflected beam describes on the surface of the sample during the removal influences the composition and the thickness of the individual coats of the deposited solid layer. If, for example in the case of rotation of a disc-like sample which is divided into sector-like portions having different material compositions, the emitted beam is deflected in such a way that the beam repeatedly passes through the entire diameter of the surface of the sample through the centre point of the surface of the sample during the removal, more material is accordingly converted into the gaseous state than if the beam is repeatedly deflected merely radially outwards from the centre point of the surface of the sample to the periphery of the sample. The gaseous material cloud thus has a higher material concentration when the beam is deflected over the entire diameter of the sample than when the removal takes place merely radially, and thereby also determines the thickness of the deposited solid layer on the object to be coated. The more material present in the gaseous cloud, the thicker the deposited coats of the solid layer on the object to be coated and vice versa. In addition, it is also conceivable for an alteration of the beam power to influence the thickness of the coats of the solid layer, since a higher beam power also results in greater removal of the material at the surface of the sample.

In the case of the material composition for the individual portions of the sample, chemically homogeneous elements, in particular pure elements of a metallic nature, for example titanium, silver, aluminium or iron, and/or of a non-metallic nature, for example boron, carbon or phosphorus, metal compositions such as alloys, and/or non-metal or non-oxide compositions, for example carbides, halogenides or nitrides, are preferably used, said non-metal compositions preferably being used in industry as protective layers against surface and interface oxidation. In addition, it would be conceivable to use ceramic composite materials as materials for the portions of the sample. These ceramic composite materials are characterized by their flexibility, which is due to the additionally processed plastics fraction in the ceramic composite material. When ceramic composite material is used as material for portions of the sample, it is thus possible for example to avoid the formation of material fragments from the surface of the sample. The organic fraction of the ceramic composite material, in this case the flexible plastics fraction, is preferably decomposed during the removal of the surface of the sample, whereas the ceramic fraction of the ceramic composite material is converted into the gas phase during the removal of the surface of the sample and is deposited as a solid layer on the object to be coated. If different material compositions are present in the portions of the sample, that is to say if the material of the portions of the sample comprises different components, for example metals, chalcogenides or halogenides, the emitted beam removes the surface of the sample and thus simultaneously also the surface of the portions of the sample, whereby the different material compositions of the portions of the sample are preferably simultaneously in the gaseous state. If a disc-like sample is divided for example into two portions of the sample, the compositions of the portions differing from one another and the portions of the sample describing a semicircle, and if this sample describes a rotational movement about its central axis with simultaneous horizontal movement altering the orientation of the course of the emitted beam over the entire diameter of the sample, the surfaces of the two portions are removed continuously and converted into the gaseous state. The gaseous cloud thus comprises the two material compositions of the removed portions of the sample. If the material compositions of the portions of the sample in the gaseous material cloud are unreactive chemical compounds, the material compositions of the two removed portions of the sample are deposited as a solid layer on the object to be coated, that is to say that the deposited solid layer comprises the two material compositions of the two portions of the sample. If the material compositions of the portions of the sample in the gaseous material cloud are reactive chemical compounds, these may react with one another, at least in part, and form new chemical bonds among one another. The deposited solid layer may thus also contain the newly formed chemical compound of the two material compositions in addition to the material compositions of the two removed portions of the sample. The composition of the materials in the deposited layers can be set and varied by the route of the beam course over the surface of the portions of the sample, whereby for example concentration gradients within a layer and/or between at least two layers arranged directly adjacent to one another can be produced.

According to a preferred embodiment, the different portions of the sample are in the form of layers and/or regions located side by side on the surface of the sample. Said layers may for example be formed as successive layers parallel to the surface of the sample, each layer preferably having a material composition which is different from the material compositions of the adjacent layers. It is also conceivable for the portions of the sample which have different material compositions to be arranged directly adjacent to the surface of the sample. The portions can have any desired geometric design, for example sector-like, circular or angular. The portions of the sample are preferably also arranged continuously in the volume of the sample. Thus, for example, a portion of the sample may simultaneously form, with a first portion face, at least part of the surface of the sample and, with a second portion face opposite the first portion face, part of the underside of the sample.

According to a preferred embodiment, the different portions of the sample are moved perpendicular to the surface of the sample, preferably individually, during the removal step. On the basis of the beam power, material compositions of the portions having different chemical and physical properties can be removed at different speeds. This results in roughening of the surface of the sample, which leads to the formation of edges or steps in the material of the surface of the sample at the interfaces between two adjacent portions of the sample, causing shadowing effects. Via the selective movement of the portions of the sample perpendicular to the surface of the sample, preferably individually, edge or step formation in the material at the interfaces is avoided, and this simultaneously reduces the formation of any material fragments from the edges or steps during the removal of the surface of the sample. The displacement of the portions of the sample is controlled by at least one control means, which preferably controls a linear drive.

The present invention also comprises an apparatus for applying solid layers to an object to be coated by means of a radiation source, in particular a laser radiation source, an orientation alteration device for altering the course of the emitted beam and a vacuum chamber having a sample being arrangable therein which preferably comprises different portions, is movable by means of a first external drive device and the surface of which can be removed by the beam, the orientation of the beam course being movable and the sample simultaneously being movable. The apparatus according to the invention comprises an orientation alteration device for altering the course of the emitted beam, which device comprises at least one mirror, preferably a galvanometer mirror, which is uniaxial, but preferably biaxial, and/or at least one beam expander, preferably a prism for increasing the diameter of the emitted beam for large-scale removal of the surface of the sample, and/or at least one focusing device, preferably a lens, by means of which the shape of the cross-section of the beam can be altered. Besides a round cross-section, the beam may also have for example an angular, preferably square, cross-section, in order thus to ensure uniform removal of the surface of the sample if the sample geometry is also angular, for example. It is preferably conceivable to alter the cross-section of the beam of a three-dimensional laser scanner in such a way that even complex sample shapes can be removed uniformly and the formation of agglomerates in the gas phase of the converted removed material of the sample and the formation of material fragments from the surface of the sample are avoided. In addition, the three-dimensional laser scanner makes it possible to set a constant beam focus over the entire sample surface.

According to a preferred embodiment, the different portions of the sample are arranged as layers and/or as regions located side by side, which differ in their material composition. It is thus possible to provide a plurality of materials simultaneously. If the portions of the sample are arranged in layers which are parallel to the surface of the sample, it is thus possible, after removal of an upper first layer, to transfer a subjacent second layer having a different material composition to the object to be coated, without having to change the sample in a time-consuming manner.

The geometric configuration of the sample is preferably that of a three-dimensional body. For example it may have a round basic shape, such as a disc or a cylinder, or else a polygonal geometry, for example square, rectangular or triangular. The diameter, that is to say the size of the surface of the sample, is preferably not limited to only the conventional laboratory sizes of a few centimeters. Samples having a large diameter in the range of from 1 to 15 cm are preferably used, the sample having any desired geometric configuration. In addition, it is also conceivable for the three-dimensional sample body to be a strip having an angular cross-section or to be a wire which has for example a round cross-section and which is supplied as a continuous body, in order thus to coat large-scale objects without having to interrupt the process at regular intervals, for example after complete removal of the sample material of a disc-like sample, in order to replace the used sample and re-evacuate the vacuum chamber.

According to a preferred embodiment, the invention has an object to be coated which is arranged such that it can be moved by means of a second drive device. During the deposition of the gaseous state, the object to be coated can be moved vertically and horizontally or in a combination of the two movements in relation to the surface of the sample. It is also conceivable for the object to be coated to be arranged such that it can be rotated about an axis during the deposition of the gaseous state, this axis being arranged perpendicular to the face on which the gaseous state is deposited and preferably passing through the centre point of said face. In addition, the object to be coated can, preferably simultaneously, be displaced by means of the second external drive device in such a way that the distance between the surface of the sample and the object to be coated can be altered. In the present invention, the thickness of the deposited solid layer and the uniform deposition of the gaseous state of the removed sample material on objects to be coated having a large surface are preferably controlled via this movement of the object to be coated, without altering the beam parameters, for example beam energy or beam diameter. The movement of the object to be coated preferably takes place at the same time as the movement of the sample and the alteration of the course of the emitted beam. This allows rapid removal of the sample surface and the coating of objects which are several square meters in size. The object to be coated can also be plate-like, designed as a three-dimensional body or even as a type of continuous strip.

In another preferred embodiment, a mask is arranged between the sample and the object to be coated. This mask can be arranged in a stationary manner on a carrier element opposite the object to be coated. The mask is preferably arranged pivotally, such that its position can be altered. The pivoting preferably takes place about an axis which extends perpendicular to the horizontal surface of the mask, the axis having any desired course. The mask preferably has at least one opening which makes it possible for the gaseous state of the sample to be deposited on the object to be coated in the geometric shape of the opening. It is also conceivable for the mask to have a plurality of openings which have different geometric configurations. In addition, it is also conceivable for the mask to be arranged such that its position in relation to the object to be coated can be altered by guide systems, for example in the form of rails.

The device referred to as a radiation source in the present invention can be a laser radiation source, which preferably produces a pulsed laser beam and more preferably a femtosecond pulsed laser beam, a high-energy electron or neutron radiation source or a plasma source.

In addition, it is also conceivable for not just one beam to be used to remove the sample surface. This can be achieved for example via a plurality of radiation sources which emit radiation having an alterable course, or via beam splitters which split the originally emitted beam into at least two sub-beams. For example, four beams having a cross-section which is variable in terms of shape and size, which can all be deflected individually by orientation alteration devices and the course of which can thus be moved, can thus remove simultaneously four portions of a sample which differ in terms of shape and/or material composition. This saves time and also allows the composition of the deposited solid layer to be controlled.

The invention will be described in detail below with reference to a preferred embodiment in conjunction with the appended drawings, in which.

Figure 1:
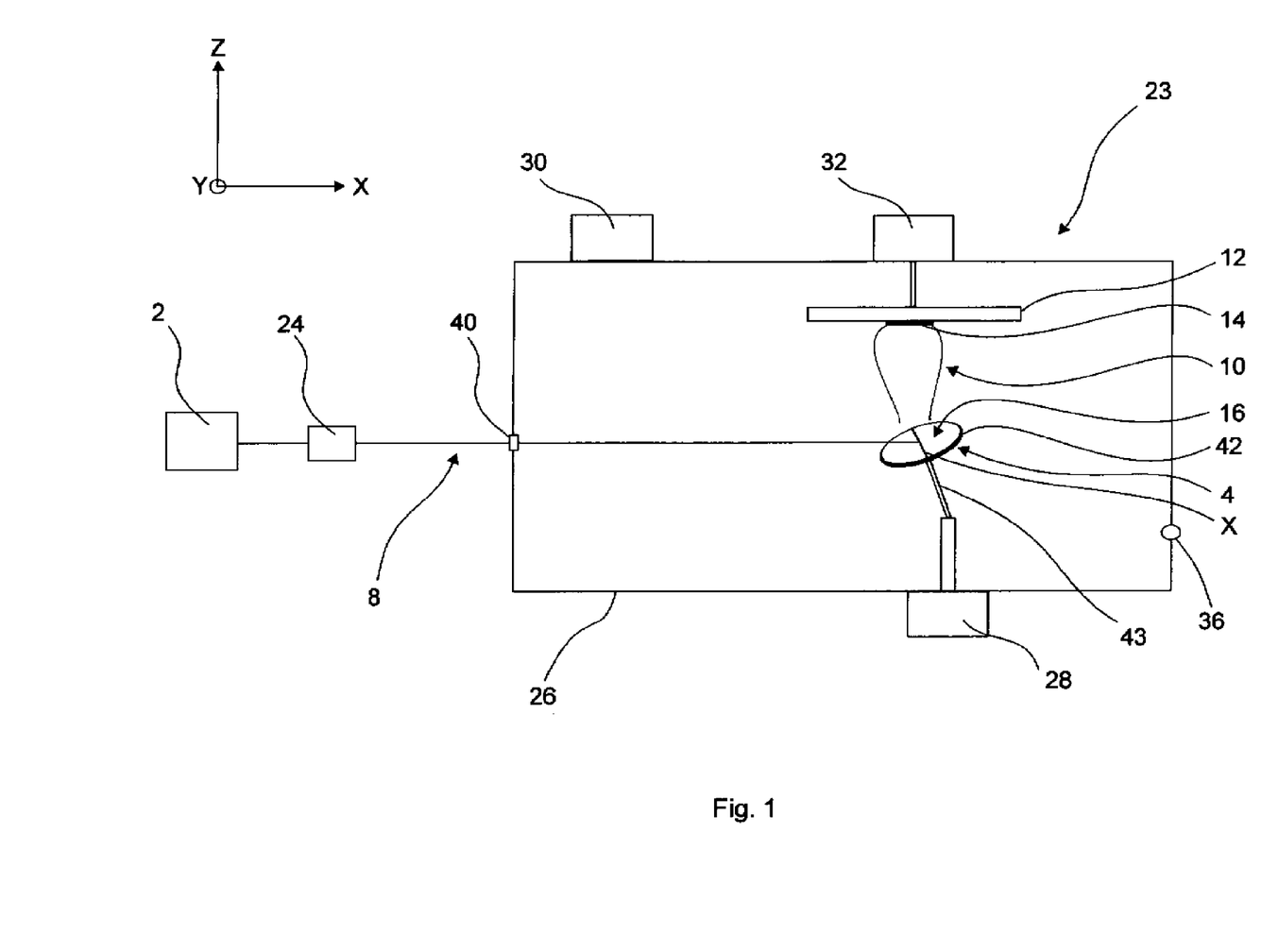
FIG. 1 is a sectional view of the apparatus according to the invention.

FIG. 1 shows an example of an embodiment according to the invention of the apparatus 23. The radiation source 2, which is arranged outside the vacuum chamber 26, can be for example a laser radiation source, a pulsed femtosecond laser beam preferably being emitted. An orientation alteration device 24 is arranged, preferably outside the vacuum chamber 26, in the course of the emitted beam 8 in the x direction. This orientation alteration device 24 preferably has at least one mirror, in particular a biaxial galvanometer mirror, for deflecting the emitted beam 8, at least one device for focusing and/or defocusing and a device for splitting the beam 8 (not shown). In the further course in the x direction, the beam 8 passes through at least one optical window 40 of the vacuum chamber 26, in which a low pressure, preferably a vacuum, prevails and is produced and maintained by means of a pump device 30. In addition, a sample 4, which preferably consists of different portions 6 (not shown), is arranged on a sample carrier 42 in a replaceable manner in the vacuum chamber 26. The sample carrier 42 is connected via a sample carrier holder 43 to a first external drive device 28 via a guide means, via which the spatial inclination of the sample 4 can be set. An object 12 to be coated is also arranged in the vacuum chamber 26 and can be displaced from its position via a second external drive device 32 in such a way that the object 12 to be coated is moved preferably linearly, for example horizontally or vertically in relation to the sample 4. In addition, the distance between the surface 16 of the sample 4 and the object 12 to be coated can also be set by means of a second external drive device 32 such that said distance can be altered in the z direction. The beam 8 hits the surface 16 of the sample 4 and converts the solid sample material into the gaseous state 10, in this case in the form of a gaseous material cloud. During the removal of the surface 16 of the sample 4, a simultaneous movement of the sample 4 and a movement altering the orientation of the course of the emitted beam 8 take place. As shown by way of example in FIG. 1, the sample is formed as a round disc which rotates about its central axis, which is perpendicular to the surface 16 of the sample 4 and passes through the centre point Z of the surface 16 of the sample 4, during the removal. The orientation of the course of the emitted beam is simultaneously altered in a linear horizontal manner from the original beam course, that is to say that the beam 8 is deflected from its original beam course in the x direction into the xy plane, and describes a path of movement X of the beam 8 on the surface 16 of the sample 4. The length of this path of movement X preferably corresponds to the diameter of the sample 4 and preferably extends, in the case of a rotating disc-like sample 4, through the centre point Z of the surface 16 of the sample 4. The surface 16 of the sample 4 is removed in a high-energy manner, that is to say that solid particles are accelerated during the transition into the gaseous state 10 of the sample 4 and are deposited as a solid layer 14 on the object 12 to be coated. The solid layer 14 may be present for example as an atomic monolayer, a layer several micrometers thick or as a multilayer consisting of a plurality of coats which differ in terms of their material composition. With extremely short removal times of a portion 6 of the sample 4, the gaseous material composition 10 can be deposited in a locally limited manner, preferably in the form of islands, on the object 12 to be coated. This can be used for example to produce stepped solid layers 14, which as a whole are still uniformly thin with regard to their thickness.

In addition, the spatial orientation of the sample 4 is altered during the removal of the surface 16 of the sample 4 by the emitted beam 8, preferably in terms of a spatial angle of inclination. The spatial angle of inclination of the sample 4 is understood to mean the angle by which an axis of the sample, which axis extends perpendicular to the surface of the sample 4 through the centre point Z of the surface 16 of the sample 4, differs from the z axis of the coordinate system. This means a spatial inclination of the sample surface 16 in the xz plane as well as in the yz plane. The sample carrier 42 is used to receive and fix the sample 4, for example by screwing or tension springs, during the removal of the surface 16 of the sample 4 by the emitted beam 8 and is preferably adapted to the geometry of the sample 4. A first end of a sample carrier holder 43 which spaces the sample carrier 42 apart from the first external drive device 28 is arranged on the side of the sample carrier 42 remote from the sample. The sample carrier holder 43 has at the second end a guide means, for example a ball-and-socket joint, which can be inserted in a correspondingly shaped recess in the first external drive device 28. This guide means makes it possible to alter the spatial angle of inclination of the sample, the guide means preferably being actuated electronically. It is also conceivable for said guide means to be located directly between the sample carrier 42 and the sample carrier holder 43, only the spatial angle of inclination of the sample carrier 42 and thus also of the sample 4 being alterable, with the sample carrier holder 43 remaining unmoved in its position. The guide means can also be designed in a variety of ways. The alteration of the spatial angle of inclination preferably takes place at the same time as the rotation or linear movement of the sample 4. Via the alteration of the spatial angle of inclination of the sample 4, the gaseous material cloud 10 can be directed to different regions of the object 12 to be coated, in order to be deposited there as a uniformly thick solid layer. It is thus not necessary for the sample and the object to be coated to adopt a predetermined fixed orientation relative to one another.

The vacuum chamber 26 has at least one additional external inlet 36 through which, for example, gas or gas mixtures can be introduced into the vacuum chamber 26, in order to produce solid layers 14 on the object 12 to be coated. Introducing reactive gases, for example oxygen, into the vacuum chamber 26, also causes a chemical reaction between the gas and the gaseous state 10 of the sample 4, whereby newly formed chemical compositions are deposited on the object 12 to be coated, at least in part. In order to further improve or accelerate this reaction respectively, the gas can be activated separately, for example by splitting it into its atoms in the form of a plasma.

Figure 2:
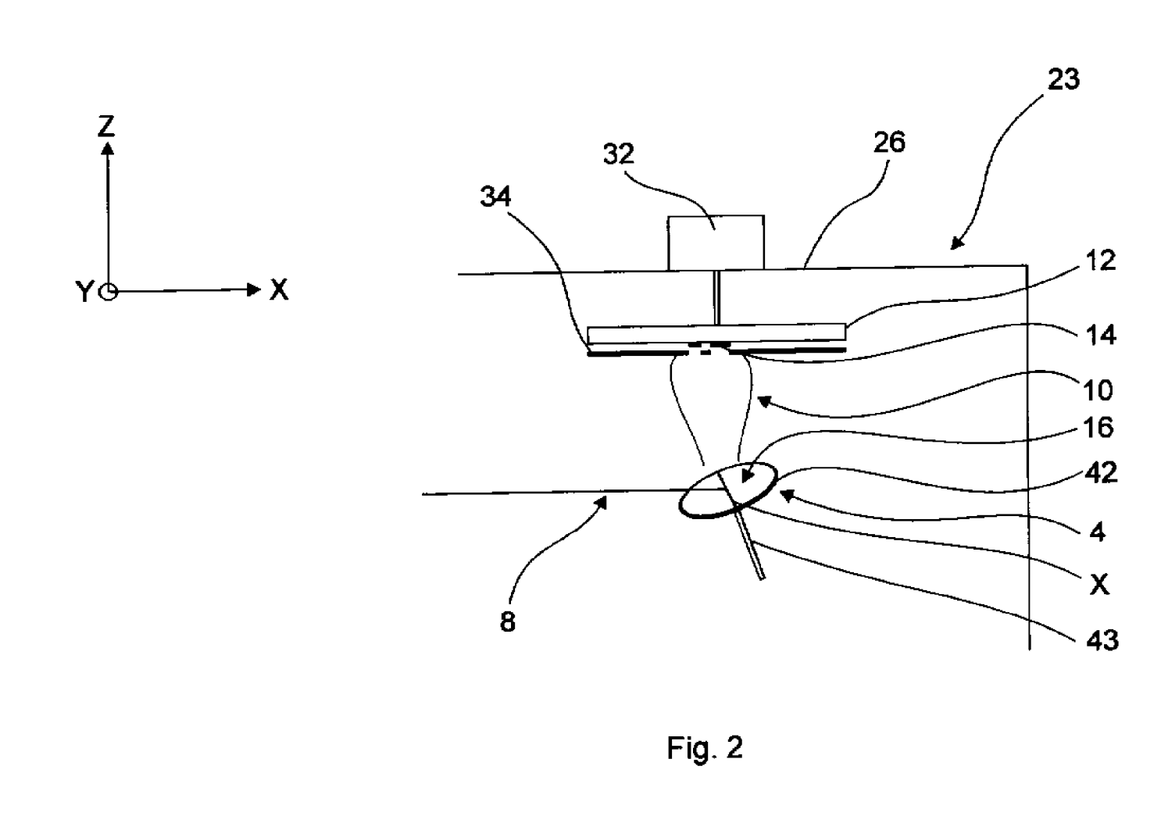
FIG. 2 shows a detail of the sectional view of the apparatus according to the invention from FIG. 1.

There is also the option, as shown in FIG. 2, of providing at least one additional stationary and/or movable mask 34 which has at least one opening 38. This opening 38 can be round or angular, preferably in the form of a linear slit. It is also possible to provide a plurality of openings 38 which preferably differ in terms of their geometric configuration. It is conceivable for the mask 34 to be arranged such that it can be pivoted about an axis which extends perpendicular to the horizontal surface of the mask 34, preferably through a corner of the mask 34, such that it can be fixed by means of screws on a frame-like system and/or in a replaceable manner on a rail-like guide system, preferably in the form of slide rails (not shown). This allows an additional local deposition of the gaseous state 10 of the sample 4 on the object 12 to be coated. This is advantageous in particular in control engineering and metrology when it is a matter of producing circuits. It is also conceivable to provide a plurality of masks 34 having openings 38 provided at different points, which masks are preferably applied in turn when the sample 4 is the gaseous state 10 in order thus not to limit the geometry of the deposited solid layers 14 to single coats or gradients, but to extend it to complex structures, for example circuits.

Figure 3:
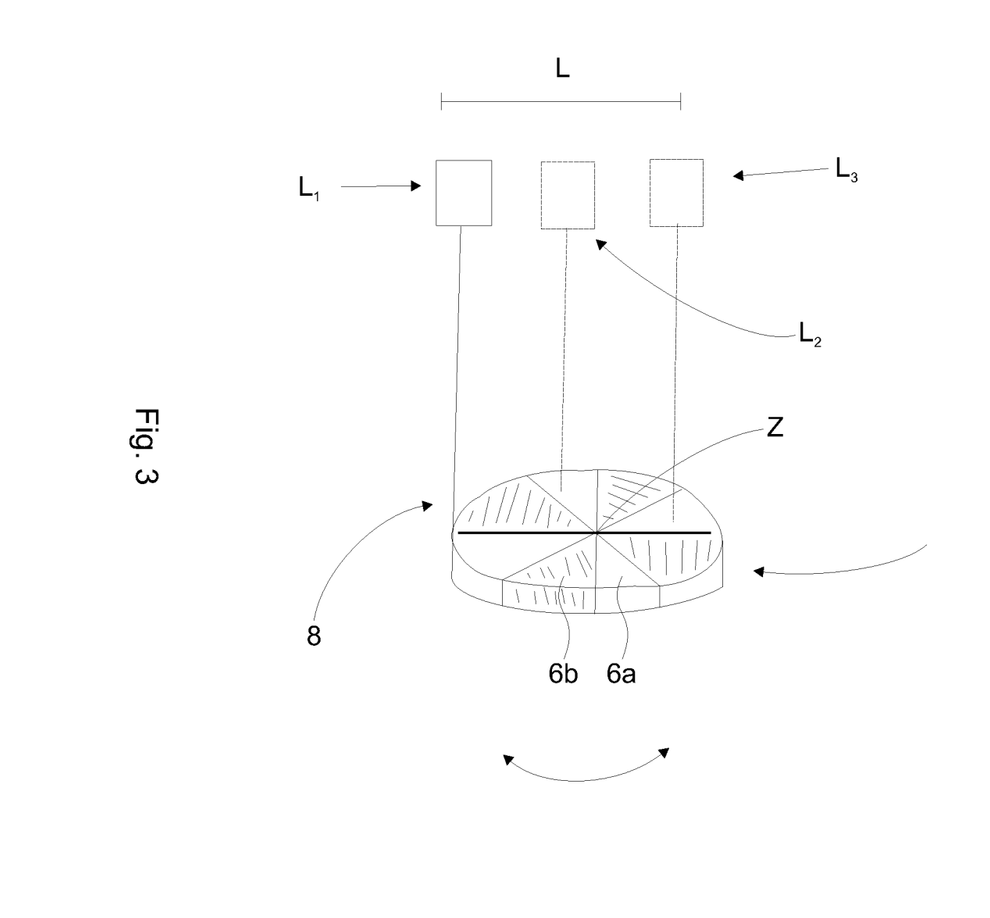
FIG. 3 is a schematic view of the laser movement.

FIG. 3 is an exemplary schematic representation of the alteration of the course of the beam 8 during the removal step in relation to a rotatably arranged, disc-like sample 4 comprising the different sector-like portions 6a and 6b, portion 6a comprising a material A which differs in terms of composition from the material B of portion 6b. The beam 8 hits the surface 16 of the sample 4 in position L1 and its course is altered in a linear manner in direction L via positions L2 and L3, while the sample 4 simultaneously rotates, preferably about an axis which is perpendicular to the sample surface 16 and passes through the centre point Z of the surface 16 of the sample 4. This movement can, in the event that the speed of the alteration of the course of the beam 8 is very high in relation to the speed of the movement of the sample 4, take place along the path of movement X of the beam 8 at the surface 16. This path of movement X extends preferably over the entire diameter of the sample 4. In addition, the path of movement X can also for example be directed radially or respectively along a predetermined distance on the surface 16 of the sample 4. In addition to the rotation of the sample 4, the composition of the gaseous state 10 is set via the length and the route which the path of movement X describes on the surface 16 of the sample 4, and this also determines the composition of the deposited solid layer 14.

Figure 4A:
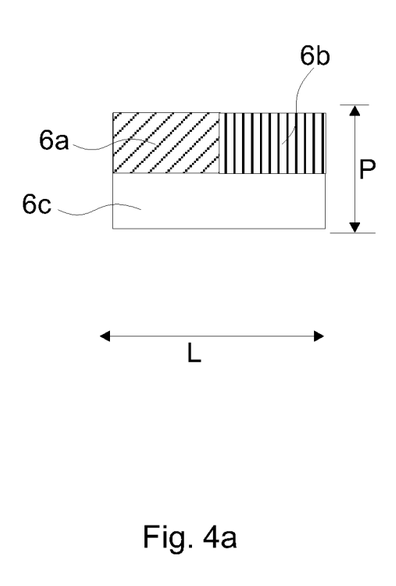
FIG. 4 shows another possible movement of the laser and of the sample in the present process according to the invention.
Figure 4B:
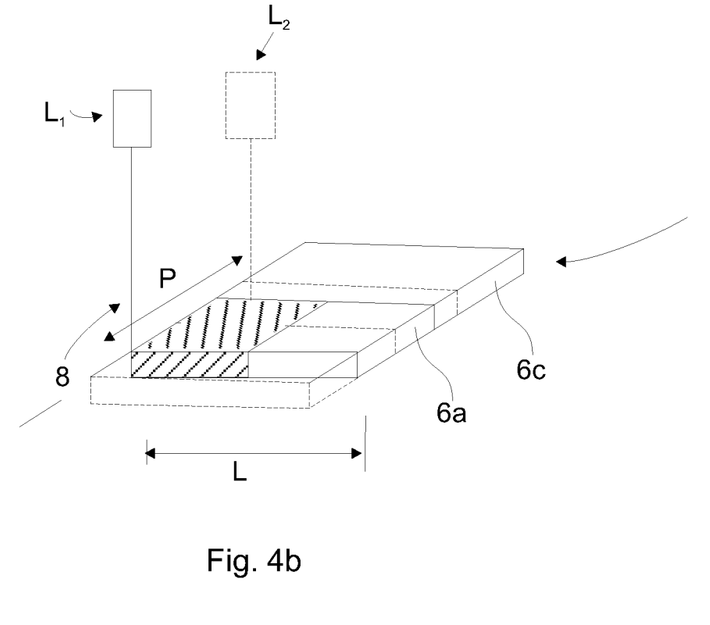

FIG. 4a shows the surface 16 of a polygonal sample 4, which in this case is provided for example as a cuboid, the surface 16 of the sample 4 being divided into different portions 6a-c. The individual portions 6a, 6b and 6c have different material compositions, pure elements and/or mixed compounds preferably being provided. The alteration of the course of the emitted beam 8 is shown schematically in this figure, and takes place for example in a linear manner in the horizontal direction L, with simultaneous linear movement of the sample 4 in the vertical direction P. Thus, initially only the two portions 6a and 6b are removed. In the further course of the simultaneously occurring linear movements of the beam 8 and the sample 4, portion 6c is removed. The movements of the sample 4 and of the beam 8 are repeated until the target coating in terms of thickness and composition has been deposited. This movement sequence is shown in a perspective view in FIG. 4b. If the linear movement of the sample 4 is slow in comparison with the alteration of the course of the beam 8, then line-type removal of the materials preferably occurs. The movement of the sample 4 is preferably vertical and the movement altering the course of the beam 8 is preferably horizontal. Particularly preferably in the case of polygonal sample geometries, the cross-section of the beam 8 is not round. A beam cross-section which, for example, is angular is advantageous, since this cross-section can be adjusted precisely by the present process and removes the sample material uniformly. A round beam cross-section always requires an overlapping path of movement X in the case of a linear movement of the angular sample 4. The movements of the sample 4 and of the beam 8 are preferably adapted to one another in such a way that there is no offset at the material interfaces of the portions 6.

Figure 5A:
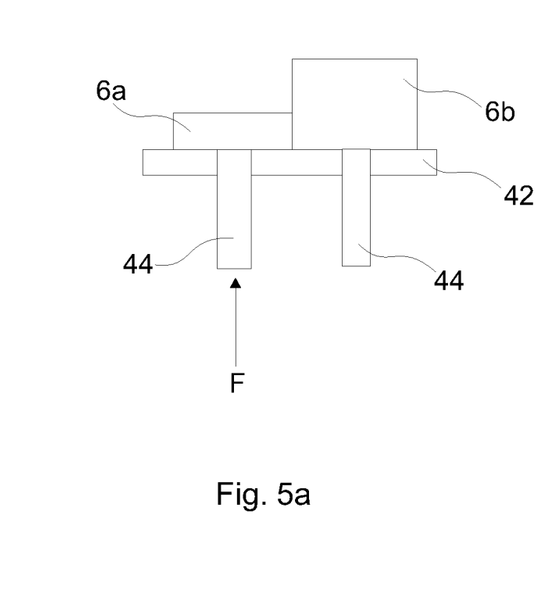
FIG. 5a is a sectional view of the movable portions of the sample.
Figure 5B:
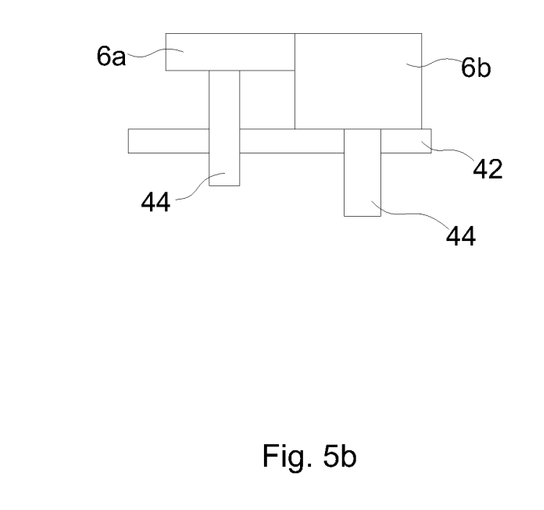
FIG. 5b is a further sectional view of the movable portions of the sample.
Figure 6A:
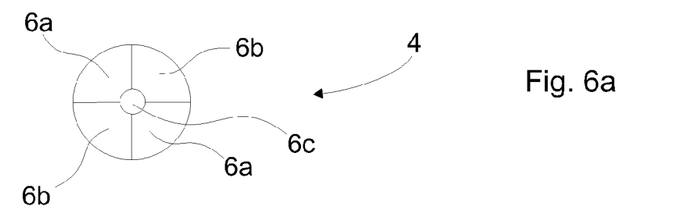
FIGS. 6a-6d show examples of a geometric design of the sample.
Figure 6B:
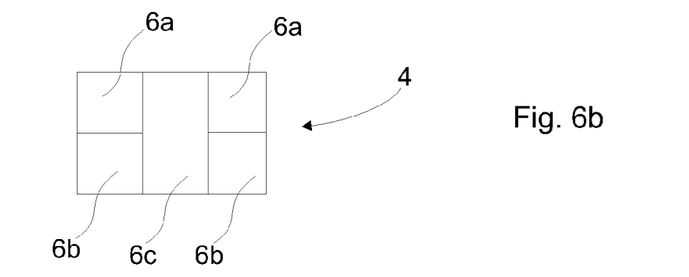
Figure 6C:
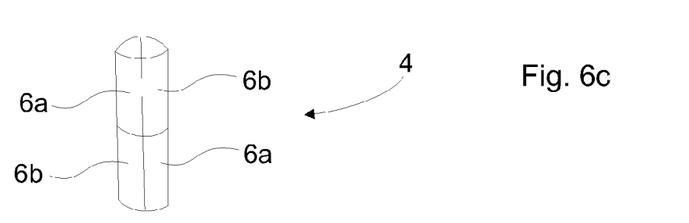
Figure 6D:
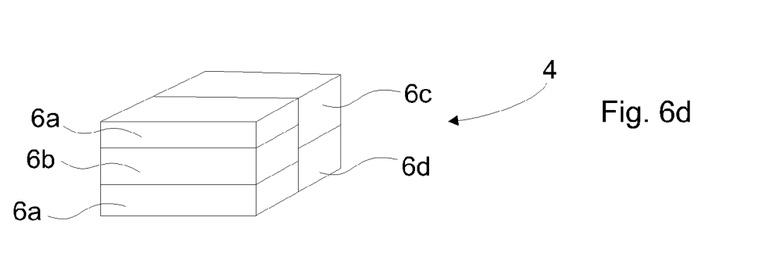

FIG. 5a shows a cross-section of a disc-like sample 4 which comprises the portions 6a and 6b. If, for example, a pulsed nanosecond laser is used as a radiation source 2, there is material-dependent removal of the portions 6a and 6b, for example material A being removed substantially faster from portion 6a than material B from portion 6b. In this case, the portion 6a decreases in thickness faster than portion 6b. The resulting differences in height between the portions 6a and 6b lead to undesirable shadowing effects, which, in the case of continuous removal steps, lead to reduced deposition of the gaseous phase 10 on the object 12 to be coated. Therefore, the apparatus 23 of the present invention preferably has at least one movable plunger 44 which can be displaced from its starting position in a direction of movement F and, during the displacement in direction of movement F, displaces with it at least one portion 6 of the sample 4. The plunger 44 is preferably arranged in relation to the sample carrier 42 such that it can be displaced in its position in direction of movement F, the plunger 44 being moved perpendicular to the surface 16 of the sample 4. Preferably, each portion 6 of the sample 4 has a movable plunger 44 which covers the underside of the portion 6 of the sample 4 in a planar manner, at least in part. In addition, it is also conceivable for the movable plunger 44 to contact the underside of the portions 6 of the sample 4 merely at points, in order to lift said portions in direction of movement F from their starting position in a manner perpendicular to the surface 16 of the sample 4. It is also conceivable for all portions 6 having the same material composition to be lifted simultaneously. The movement of the plunger 44 takes place preferably at the same time as the two likewise simultaneous movements of the sample 4 and the alteration of the course of the emitted beam 8, and is preferably designed such that the lifting of the more rapidly removed portions 6 of the sample 4, in this case embodied by way of example in portion 6a, is adjusted continuously during the removal of the surface 16 of the sample 4, such that, as shown in FIG. 5b, at any moment during the removal a uniform surface quality of the sample 4 is ensured by displacement of the more rapidly removed portions.

FIG. 6 shows examples of the design of the sample 4 which have provided a particularly good basis for uniform solid layers 14 during the presented process. FIG. 6a shows a round, disc-like configuration of the sample 4, which comprises three different portions 6a, 6b and 6c, portion 6a consisting of material A, portion 6b of material B and portion 6c of material C and these materials differing from one another in terms of their composition. The portions 6a and 6b are sector-like and adjacent to the circular portion 6c. This configuration is merely a possible example of a sample geometry. It is also conceivable for multiple different portions 6 of the sample 4 to be arranged side by side and in succession at the surface 16 of the sample 4. This makes it possible to coat large-scale objects 12, since during the process the volume of the gaseous state 10 also increases owing to increased removal of material as a result of the increase in diameter of the sample 4. The exemplary sample 4 shown in FIG. 6b has an angular geometry and comprises portions 6a, 6b and 6c which likewise differ in terms of material composition. In addition, the three-dimensional design of the sample 4 can be for example in the form of a cylinder or rod which is divided into different portions 6 of the sample 4, which again consist of different materials (FIG. 6c). It is also possible for the sample geometry to be angular, preferably in the form of a cube or cuboid, and the different portions 6 of the sample 4 can be formed preferably in layers parallel to the surface 16 and particularly preferably as regions perpendicular to the surface 16 of the sample 4 and penetrate the volume of the sample, at least in part (FIG. 6d). In addition, spiral arrangements of the portions 6 in the volume and also at the surface 14 are also conceivable (not shown). In addition, if large-scale samples 4 are used, it is advantageous to use a beam splitter which splits the emitted beam 8 in such a way that material removal occurs simultaneously at a plurality of positions on the sample 4. The present invention thus allows uniform and rapid deposition of solid layers 14 on large-scale objects 12.

Figure 7A:
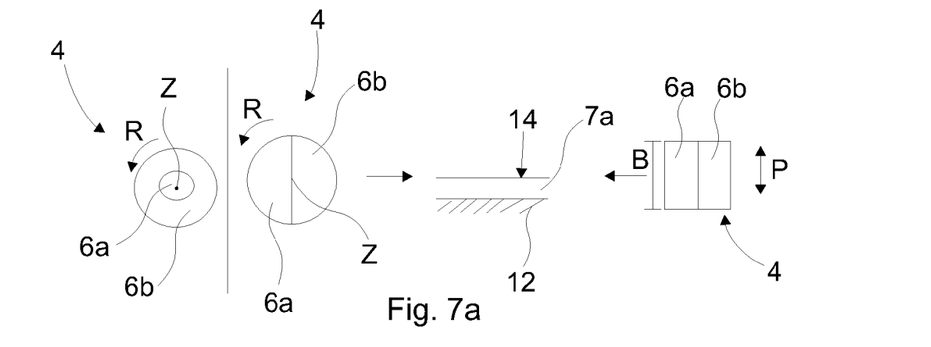
FIGS. 7a-7c show examples of schematic solid layers.

FIG. 7a shows a cross-section of an exemplary deposited solid layer 14 on the object 12 to be coated (centre) in the case of the alteration of the course of the emitted beam 8 in a horizontal direction of movement L. If, for example, a round, disc-like sample 4 (left-hand view) which comprises a portion 6a having material composition A and a portion 6b having material composition B, the two portions being provided for example as concentric full circles or as semi-circular segments, is set in rotation in arrow direction R about an axis which is perpendicular to the surface 16 of the sample 4 and which passes through the centre point Z of the surface 16 of the sample 4, and the removal of the surface 16 by the horizontally deflected emitted beam 8, the direction of movement of which preferably passes through the centre point Z of the surface 16 of the sample 4, takes place simultaneously, then material A from portion 6a and material B from portion 6b are converted into the gaseous state 10. This material is deposited on the object 12 to be coated as coat 7a of a solid layer 14 having the composition $A_xB_y$, the indices x and y of the total formula $A_xB_y$ respectively representing the number of atoms of material A and material B in the molecule and being alterable according to the invention, preferably from coat to coat. Via the duration of the removal process, the layer thickness of the solid layer 14 is set, inter alia. An analogous solid layer 14 can be produced for example also by a rectangular sample 4 (right-hand top view) which is displaced in the vertical direction P and which likewise comprises a portion 6a having material composition A and a portion 6b having material composition B, the portions 6a and 6b being rectangular, each corresponding to half of the entire sample surface 16 and being arranged vertically adjacent to one another.

Figure 7B:
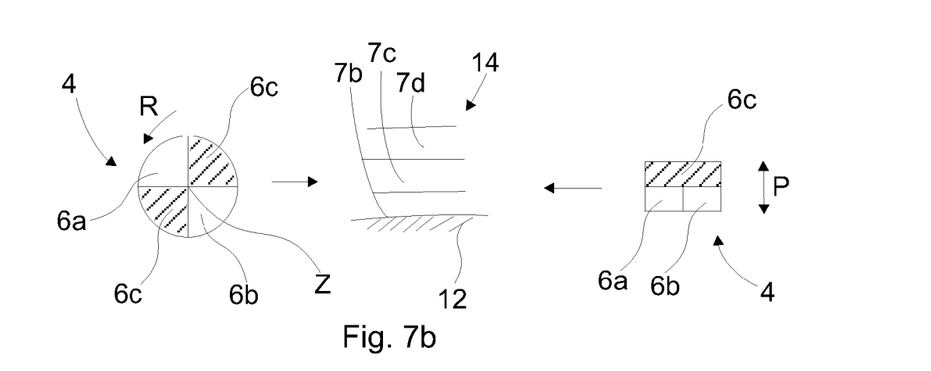

FIG. 7b shows by way of example a cross-section of a multicoat solid layer 14 (centre). Proceeding from a round, disc-like sample 4 (left-hand top view), the surface 16 of which is divided into four segments of a circle, of equal size, represented by the portions 6a, 6b and 6c, in the case of rotation of the sample 4 in arrow direction R about an axis which is perpendicular to the surface 16 of the sample 4 and which passes through the centre point Z of the surface 16 of the sample 4, with simultaneous horizontal alteration of the course of the emitted beam 8, there is initially removal of the surface of portion 6a, which is composed of material A, and of portion 6b, which is composed of material B. This means that both material A and material B are converted into the gaseous state 10 and are deposited in the composition $A_mB_n$, the indices m and n of the total formula $A_mB_n$, respectively representing the number of atoms of material A and material B in the molecule, as a first coat 7b on the object 12 to be coated. The substance ratio between material A and material B can be set via the process according to the invention. During further rotation, the two mutually opposing portions 6c are removed and the material C thereof is converted into the gas phase 10. This gaseous state 10 of the material C is deposited as a second layer 7c on the first layer 7b of the object 12 to be coated. In the further course of the process, the described operation is repeated such that a multilayer system is produced which is made up of alternating coats of the variable composition $A_mB_n$ and composition C. An analogous layer sequence can be produced for example in the presence of a rectangular sample 4 (right-hand view) which is moved in the vertical arrow direction P while the course of the emitted beam 8 is altered horizontally, and the portions 6a, 6b and 6c of which are formed as shown in FIG. 7b. The layer thickness can be set via the process according to the invention.

Figure 7C:
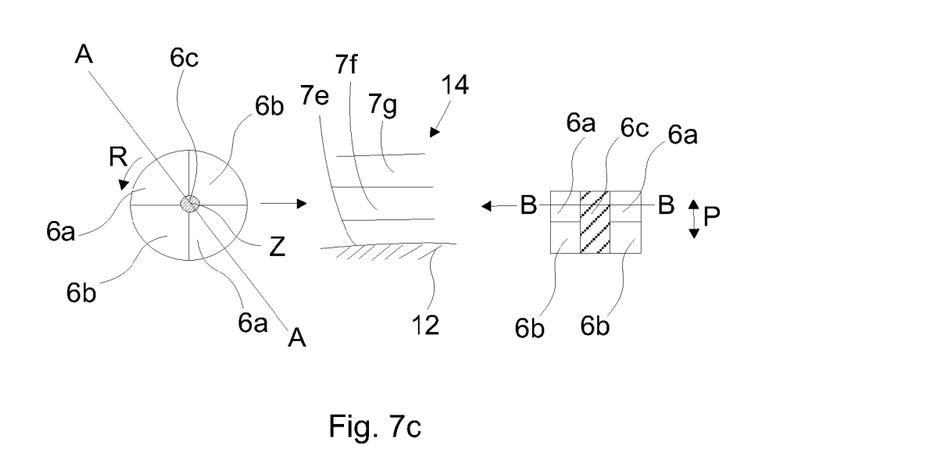

FIG. 7c shows a cross-section of a solid layer 14 as a complex multilayer system (centre). If the surface 16 of the round, disc-like sample 4 (left-hand top view) is divided in such a way that the portions 6a and 6b form four segments of a circle, of equal size, which all have a central angle of 90° and are arranged alternately, and are all arranged directly adjacent to the portion 6c, which is formed as a full circle about the centre point Z of the surface 16 of the sample 4, then the portions 6b and 6c are initially removed in the case of simultaneous rotation of the sample 4 and horizontal alteration of the course of the emitted beam 8. This means that both material B from portion 6b and material C from portion 6c are converted into the gaseous state 10 and are deposited as a first coat 7e having the composition $B_oC_p$ on the object 12 to be coated, the indices o and p of the total formula $B_oC_p$ respectively representing the number of atoms of material B and material C in the molecule, which number can differ from coat to coat. During further rotation, material A of portion 6a and material C of portion 6c are removed and converted into the gaseous state 10, which is deposited as a second coat 7f having the composition $A_rC_s$ of the first layer 7e of the object 12 to be coated, the indices r and s of the total formula $A_rC_s$ respectively representing the number of atoms of material A and material C in the molecule, which number can vary from coat to coat. During further rotation, the described operation is repeated such that a multilayer system having as many coats as desired of compositions $A_rC_s$, and $B_oC_p$ is produced, it being possible for the number of atoms of material A and material C and of material B and material C in the molecules $A_rC_s$ and $B_oC_p$ in the coats of the solid layer 14 to differ. An analogous layer sequence of the solid layer 14 can also be produced using a rectangular sample 4 (right-hand top view) which is moved in vertical direction of movement P at the same time as the beam 8 is deflected horizontally. The rectangular sample 4 comprises three different material portions 6a, 6b and 6c, the rectangular portions 6a and 6b being arranged horizontally adjacent to one another and each taking up a sixth of the sample surface 16. The portion 6c is arranged directly adjacent to the two portions 6a and 6b vertically over the entire width B of the rectangular sample 4 and corresponds to a third of the sample surface 16. The final third of the sample surface 16 is formed by two rectangular portions 6a and 6b, of equal size, which are arranged horizontally relative to one another. In this case, the portions 6a and 6c are initially removed and converted into the gaseous state 10, which is deposited as a first layer 7e on the object 12 to be coated. In the further course of movement, the portions 6b and 6c are removed, which are deposited as a second coat 7f on the first layer 7e on the object 12 to be coated. The layer thicknesses of the individual coats 7 and respectively the layer sequence of the entire solid layer 14 are set for example via the speed of movement of the emitted beam 8 or via the speed of movement of the sample 4, and via the sample region hit by the beam. Ratios of the materials in the deposited mono- and/or multicoat solid layers 14 can also be set via the geometry of the portions 6 or via the length and position of the path of movement X of the emitted beam 8 on the surface of the sample 4.

Figure 8A:
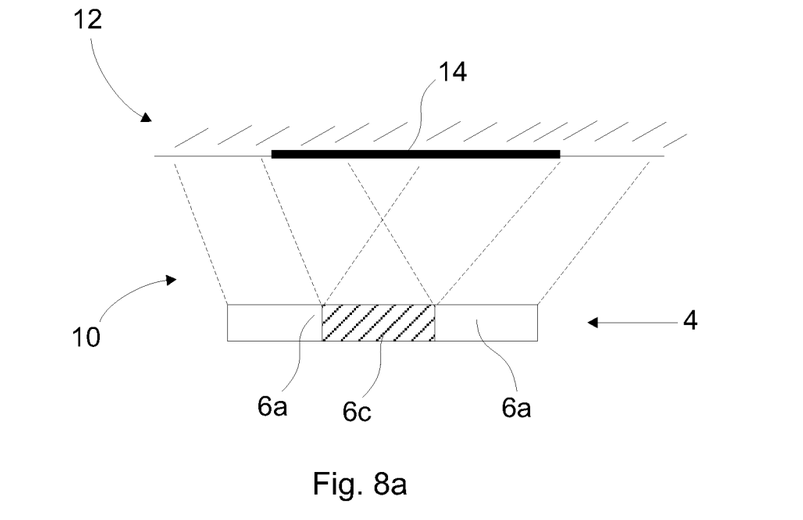
FIGS. 8a-8b are schematic cross-sections.
Figure 8B:
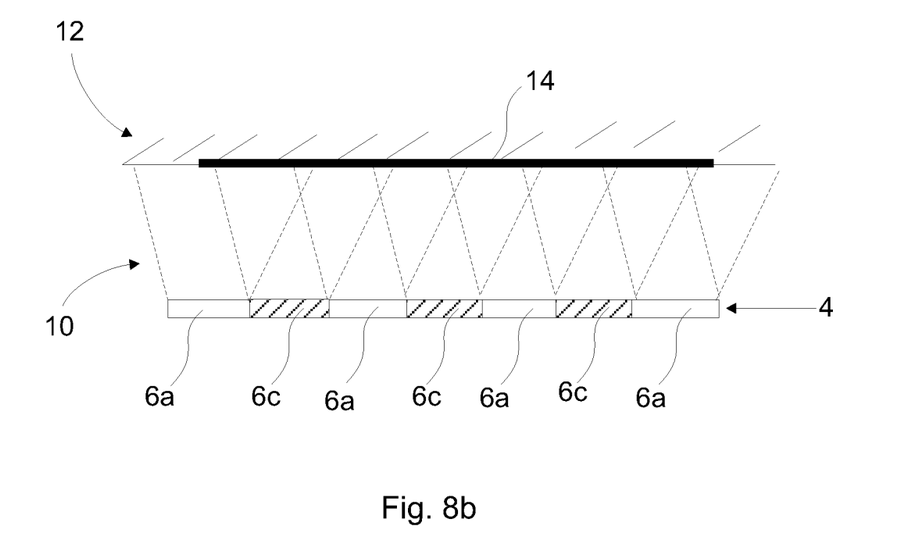
Figure 8C:
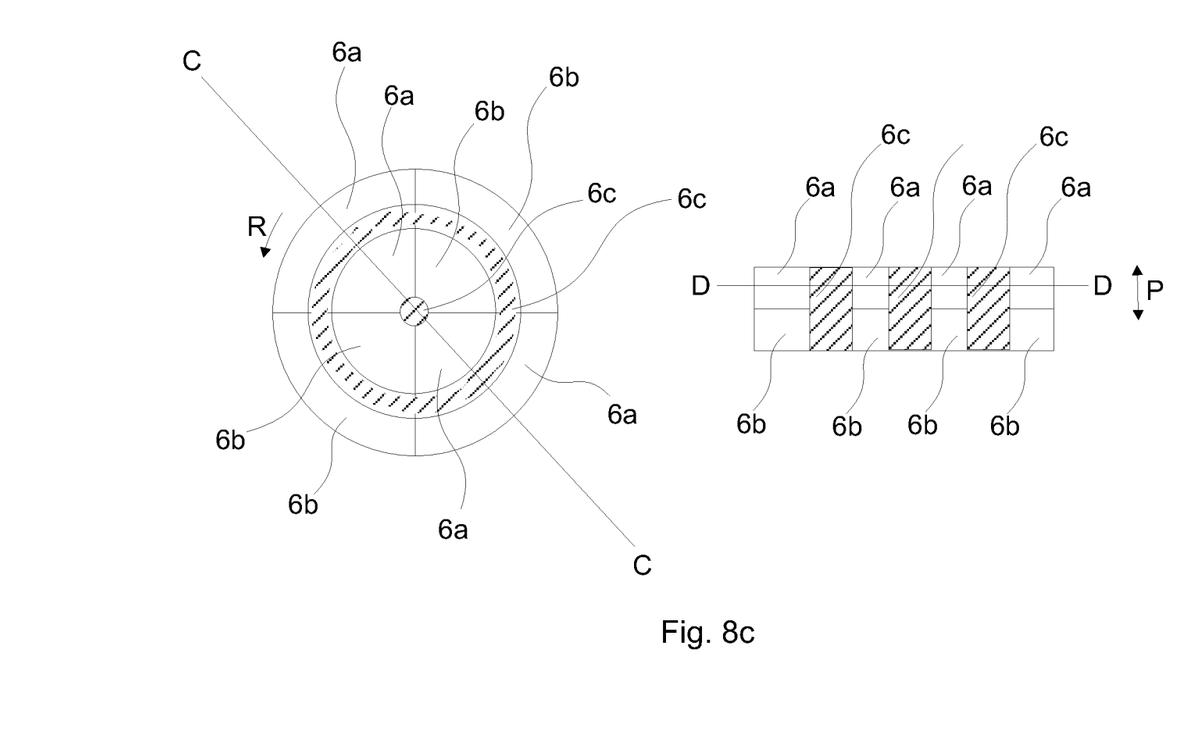
FIG. 8c is a schematic view of large-scale sample surfaces.

FIG. 8a shows a schematic cross-section of a sample 4 along the line A-A of a round sample 4 in FIG. 7c (left-hand top view) or respectively along the line B-B of a rectangular sample 4 (right-hand top view) during the conversion of the sample material into the gaseous state 10, which spreads preferably in a cone-shaped manner and is deposited as solid layer 14 on the object 12 to be coated. In this case, the course of the emitted beam 8 is altered in the horizontal direction (not shown). The exemplary cross-sectional views in FIGS. 8a and 8b show that the size of the solid layer 14 in terms of its length or its diameter respectively is determined by the size of the sample 4, that is to say the larger the surface 16 of the sample 4, the larger the areas which can be coated on the object 12 to be coated. The process can thus be adapted to the size of the object 12. FIG. 8b shows a schematic cross-section of a sample 4 along the line C-C of a round sample 4 in FIG. 8c (left-hand top view) or respectively along the line D-D of a rectangular sample 4 (right-hand top view) in FIG. 8c during the conversion of the sample material into the gaseous state 10, which spreads preferably in a cone-shaped manner and is deposited as a solid layer 14 on the object 12 to be coated, the course of the emitted beam 8 being horizontal. Owing to the larger sample surface 16, which can also be divided into different material portions 6, a solid layer 14 which is uniform in terms of material composition and thickness is possible for large objects 12. In FIGS. 8a and 8b the object to be coated is arranged directly opposite the sample surface 16 for the sake of simplicity. However, the sample 4 and the object 12 to be coated can also be arranged at angles which can be set as desired.

In addition, it must be taken into account that the speed at which the sample 4 is moved and the speed of the alteration of the course of the beam 8 during the removal step are equal on one hand, but can also differ. It is thus possible, for example, for the sample 4 to rotate much faster than the alteration of the course of the beam 8. If this is the case, the path of movement X on the surface 16 of the sample 4 adopts the form of a spiral. Owing to the variability of the two speeds of movement, of the sample 4 and of the beam 8, the path of movement X of the beam on the surface 16 of the sample 4 can be influenced.

The applicant reserves the right to claim as essential to the invention all the features disclosed in the application documents if these features, individually or in combination, are novel over the prior art.

LIST OF REFERENCE NUMERALS AND SIGNS 2 radiation source
4 sample
6 portion of the sample
6a portion of the sample comprising material A
6b portion of the sample comprising material B
6c portion of the sample comprising material C
6d portion of the sample comprising material D
7 position of the coat of the solid layer
8 beam
10 gaseous state
12 object to be coated
14 solid layer
16 surface of the sample
18b spatial angle of inclination of the sample
23 apparatus
24 orientation alteration device
26 vacuum chamber
28 first external drive device
30 pump device
32 second external drive device
34 mask
36 external inlet
38 opening in the mask
40 optical window
42 sample carrier
43 sample carrier holder
44 plunger P vertical direction of movement of the sample
L vertical direction of movement of the beam
F direction of movement of the plunger
X path of movement of the beam on the surface of the sample
Z centre point of the surface of the sample
R rotational movement of the sample
B width of the angular sample

The invention claimed is:

1. A process for applying solid layers to an object to be coated by at least one radiation source said process at least comprising the step of removing a sample in the solid state in portions which are different at least in part by at least one beam emitted by the radiation source for converting the sample, at least in part, into a gaseous state which is deposited at least in part on the object to be coated in order to form a solid layer, wherein, simultaneously, the orientation of a course of the emitted beam is altered during the removal step and the sample is moved, wherein the movement altering the orientation of the course of the emitted beam takes place on the basis of the movement of the sample, wherein the alteration movement which determines the orientation of the course of the emitted beam and the movement of the sample are interlinked in terms of their movement speed, wherein the different portions of the sample are arranged substantially continuously in the volume of the sample, and wherein the different portions are moved perpendicular to the surface of the sample individually during the removal step.

2. The process according to claim 1, wherein the orientation of the course of the beam is altered in such a way that a linear movement of the beam is produced on a surface of the sample which crosses the course of the emitted beam.

3. The process according to claim 1, wherein the beam hits at a predeterminable angle the surface of the sample which crosses the course of the emitted beam, the sample simultaneously rotating about a central axis.

4. The process according to claim 1, wherein the beam hits at a predeterminable angle the surface of the sample which crosses the course of the emitted beam, a position of the sample simultaneously being altered in a direction extending perpendicular to the course of the beam.

5. The process according to claim 1, wherein homogeneous elements are used as materials for the portions of the sample.

6. The process according to claim 5, wherein the homogeneous elements are selected from the group consisting of pure elements, metal compositions, non-metal compositions, oxides, nitrides and halogenides.

7. The process according to claim 1, wherein the different portions of the sample are layers and/or regions located side by side on the surface.

8. The process according to claim 1, wherein at least one mask is arranged in a stationary and/or movable manner between the sample and the object to be coated.

9. The process according to claim 1, wherein the different portions of the sample comprise different materials.

10. The process according to claim 1, wherein the radiation source is a laser radiation source.

11. The process according to claim 1, wherein a spatial orientation of the sample is altered during the removal of the surface of the sample by the emitted beam.

12. The process according to claim 1, wherein the sample movement includes a displacement of the entire sample in the x/y direction.

13. The process according to claim 1, wherein the sample movement includes an alteration in the spatial angle of inclination of the sample.

* * * * *